United States Patent
Krywanczyk et al.

(10) Patent No.: US 10,192,748 B2
(45) Date of Patent: Jan. 29, 2019

(54) CONTROLLING OF ETCH DEPTH IN DEEP VIA ETCHING PROCESSES AND RESULTANT STRUCTURES

(71) Applicant: GLOBALFOUNDRIES INC., Grand Cayman (KY)

(72) Inventors: Timothy C. Krywanczyk, Essex Junction, VT (US); Patrick A. Raymond, Enosburg Falls, VT (US); John C. Hall, Williston, VT (US); Damyon L. Corbin, St. Albans, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/297,848

(22) Filed: Oct. 19, 2016

(65) Prior Publication Data
US 2018/0108535 A1   Apr. 19, 2018

(51) Int. Cl.
| | | |
|---|---|---|
| *H01L 21/302* | (2006.01) | |
| *H01L 21/306* | (2006.01) | |
| *H01L 21/265* | (2006.01) | |
| *H01L 21/66* | (2006.01) | |
| *H01L 21/3215* | (2006.01) | |
| *H01L 21/3213* | (2006.01) | |

(52) U.S. Cl.
CPC .. *H01L 21/30604* (2013.01); *H01L 21/26533* (2013.01); *H01L 21/3215* (2013.01); *H01L 21/32137* (2013.01); *H01L 21/32155* (2013.01); *H01L 22/26* (2013.01)

(58) Field of Classification Search
CPC .......... H01L 21/3215; H01L 21/32155; H01L 21/32137; H01L 21/02321; H01L 21/22
USPC ........................ 438/705, 735, 737, 738, 740
See application file for complete search history.

(56) References Cited

U.S. PATENT DOCUMENTS

| | | | |
|---|---|---|---|
| 2003/0064521 A1* | 4/2003 | Lu ......................... | G01N 31/00 436/55 |
| 2003/0153192 A1* | 8/2003 | Suthar ............... | H01L 21/30604 438/695 |
| 2015/0380526 A1* | 12/2015 | Godet ............... | H01L 29/66795 438/482 |
| 2017/0025530 A1* | 1/2017 | Cooper, Jr. ......... | H01L 29/7816 |

* cited by examiner

*Primary Examiner* — Binh X Tran
(74) *Attorney, Agent, or Firm* — Anthony Canale; Andrew M. Calderon; Roberts Mlotkowski Safran Cole & Calderon P.C.

(57) ABSTRACT

The present disclosure relates to semiconductor structures and, more particularly, to a method to control depth of etch in deep via etching and related structures. The method includes: forming an interface within the substrate between an etch control dopant and material of the substrate; etching a via within substrate; and terminating the etching of the via at the interface upon detection of the interface.

19 Claims, 1 Drawing Sheet

CONTROLLING OF ETCH DEPTH IN DEEP VIA ETCHING PROCESSES AND RESULTANT STRUCTURES

FIELD OF THE INVENTION

The present disclosure relates to semiconductor structures and, more particularly, to a method of controlling the depth of an etch process and related structures.

BACKGROUND

Vias can be formed in wafers by using complex and costly etching processes. These etching processes are timed etches which typically result in inconsistent via depths, e.g., shallow or over etched trenches, particularly across different tools and layouts. In the case of shallow trench formation, the wafers may need to be scrapped at the end of line processes, due to poorly revealed vias. In the case of over etched trenches, grind wheels and the via material can be damaged during the grinding process to reveal the vias.

SUMMARY

In an aspect of the disclosure, a method comprises: forming an interface within the substrate between an etch control dopant and material of the substrate; etching a via within substrate; and upon detection of the interface, terminating the etching of the via at the interface.

In an aspect of the disclosure, a method comprises: introducing an etch control dopant into a substrate, the dopant being a different type or concentration than material of the substrate; etching of one or more trenches into the substrate while monitoring plasma gas or exhaust gas within an etching chamber; and terminating the etching when a predetermined dopant concentration or rate of change of the etch control dopant concentration is detected.

In an aspect of the disclosure, a method comprises: introducing an etch control dopant into a substrate which is provided to at an end point etching depth, the etch control dopant being a different type or concentration than material of the substrate; etching of one or more vias into the substrate; detecting a presence, absence or rate of change of the etch control dopant in plasma gas or exhaust gas of an etching chamber; and terminating the etching process based on the detecting of the presence, absence or rate of change of the etch control dopant in the plasma gas or the exhaust gas of the etching chamber.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a method of controlling the depth of an etch process and related structures. More specifically, the present disclosure controls variability in etch depth by using a dopant gradient formed at a desired depth of a wafer. The methods described herein have advantages over process of record etching to time (which does not allow for changes in etch rate), as the methods described herein create an end point detection that results in a controlled via depth of etch. Accordingly and advantageously, by implementing the aspects described herein, the yield of thru-silicon-vias (TSV) can be significantly increased, while ensuring uniformity amongst trenches and/or vias. In addition, the methods described herein provide decreased manufacturing costs, e.g., grind and etching costs, and improved process cycling times.

In specific embodiments, a substrate can be doped by a particular species, which is different than the material of the wafer, itself. By detecting an interface (e.g., presence, absence or rate of change of dopant material) between the dopant and the material of the wafer, the etch process can be reliably terminated at a desirable depth, regardless of layout and/or tools. In this way, it is possible to eliminate intrinsic variations in the etch processes, itself, between different tools (e.g., etching chambers) and/or different layouts. Accordingly, tool to tool variability and layout to layout variability can be eliminated, allowing the etch to reliably be stopped at a certain point within the wafer.

Figure 1:
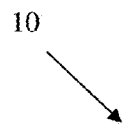
FIG. 1 shows a structure and respective fabrication processing steps in accordance with aspects of the present disclosure.
Figure 1:
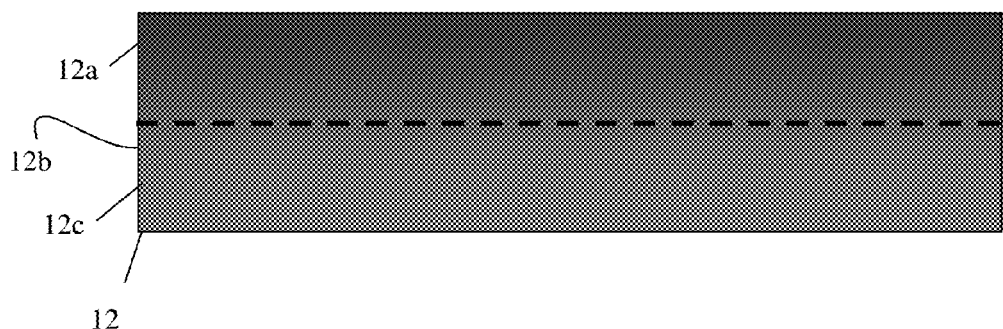

FIG. 1 shows a structure and respective fabrication processing steps in accordance with aspects of the present disclosure. More specifically, the structure 10 includes a substrate 12. In embodiments, the substrate 12 may be composed of any suitable material including, but not limited to, Si, SiGe, SiGeC, SiC, GaAs, InAs, InP, and other III/V or II/VI compound semiconductors. An etch control dopant (as shown by arrows) is introduced to the side of the substrate 12. In embodiments, the dopant can be provided from either the front side or the backside of the substrate 12.

In embodiments, the etch control dopant will be of a different species type or concentration than the material or dopant concentration of the material of the substrate 12. For example, the etch control dopant can be a N-type dopant when the substrate 12 is P type, or vice versa. The etch control dopant can also be a different concentration than the substrate 12. In embodiments, the etch control dopant can be arsenic, boron or argon, to name a few different species. In embodiments, the etch control dopant can be provided by different methods such as, for example, ion bombardment or deposition of a diffusion layer followed by a thermal process.

The diffusion or implant process can occur for a predetermined period of time or concentration in order for the etch control dopant 12a to diffuse to a desired depth within the substrate 12. In embodiments, standard diffusion tables for Si or other materials used as the substrate can be used to determine time, energy and other variables for the dopant to diffuse to a certain depth resulting in an interface 12b between the diffused portion 12a of the substrate and non-diffused portion 12c of the substrate 12. The interface 12b preferably corresponds to a desired depth of the subsequently formed vias (trenches), whether the diffusion is introduced from a front side of the wafer or a backside of the wafer. In either scenario, the etch control dopant will act as the end point indicator during front side trench etch processes. For example, the dopant (or lack thereof) can be detected in the etch chamber once the proper depth of the via (trench) has been reached.

Figure 2:
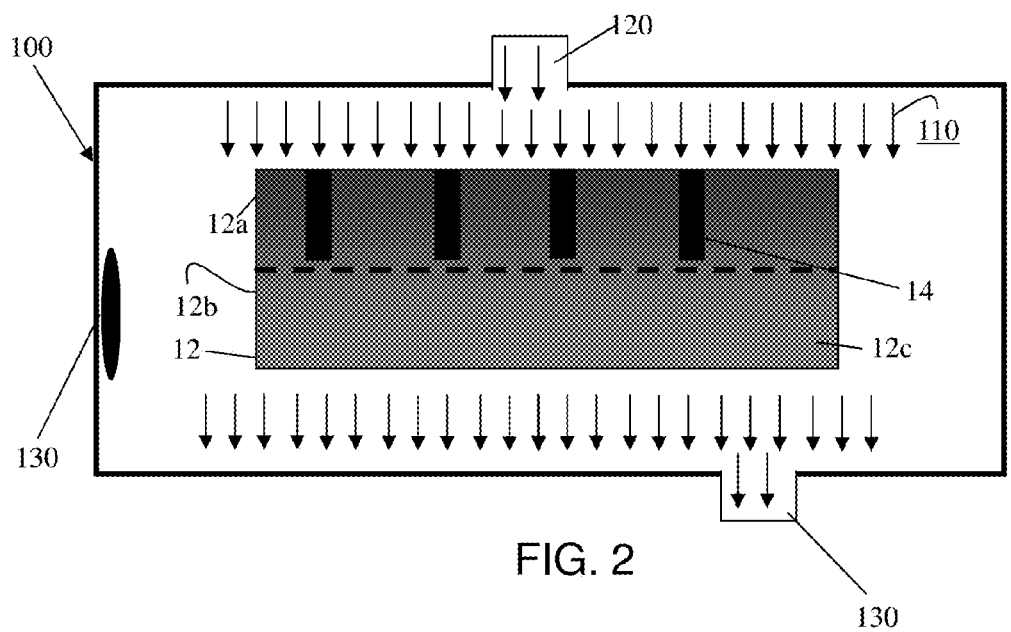
FIG. 2 shows an etching processes and vias (trenches) in accordance with aspects of the present disclosure.

FIG. 2 shows an etching processes and resultant vias in accordance with aspects of the present disclosure. In this etching process, after the substrate 12 is subjected to standard lithography processes, the substrate 12 is placed within an etching chamber 100 and a selective chemistry 110 is introduced into the chamber 100 through inlet pipe 120 to begin the etching process. The selective chemistry will form vias (trenches) 14 in the substrate 12, through patterns formed in a photoresist (which was provided by the lithography processes).

Still referring to FIG. 2, the concentration of dopant 12a or lack of dopant 12a can be detected within the etch chamber 100 or exhaust gas (at the outlet pipe 130 having exhaust gases) to determine an end point of the etch process using standard tools and/or processes. For example, the concentration of the dopant 12a or lack thereof or rate of change of the etch control dopant 12a can be detected within the plasma gas or exhaust gas by a residual gas analyzer (RGA), mass spectrometer, Optical Emission Spectroscopy (OES), laser techniques or an interferometry, all of which are depicted schematically as reference numeral 120. For example, any of the mechanisms depicted by reference numeral 120 can be tuned to detect the presence, absence or rate of change of the dopant species in the plasma gas in the etch chamber 100 or the exhaust gases exiting from the etch chamber 100 such that when a particular change is detected, the etching process can be terminated. In this way, the etch depth can be controlled not by etching time, but more precisely by the etch control dopant.

More specifically, the mechanisms 120 can detect the changes in concentration of the etch control dopant in the etch chamber 100 and/or exhaust gases as the trench etch cuts deeper into the wafer 12 and moves across the etch control dopant gradient 12a. In this way, the etch control dopant concentration or the rate of change of the etch control dopant concentration or lack of detection of the etch control dopant can be used as an end-point indicator once the proper depth of the vias (trenches) 14 has been reached. As an example, a concentration of the etch control dopant in the etch chamber 100 or exhaust 130 will change as the trench etch cuts deeper into the substrate 12 and moves across the etch control dopant gradient, thus indicating a termination or end point of the etch.

By way of more specific example, the mechanisms 120 can detect the impurity concentration or changes thereof of the dopant at a specified level. More specifically, as a non-limiting illustrative example, the dopant concentration of silicon doped with a boron at a surface concentration of $1e15$ $cm^{-3}$ at an annealing temperature of $1050°$ C. for 60 minutes to a depth of 1 μm will have a known impurity concentration at the specified depth of $7.281e6$ $cm^{-3}$, which can be detected by the mechanisms 120. In this example, as the concentration decreases or increases, depending on a front or backside doping, the processes described herein will detect the change in concentration, e.g., as the trench etch cuts deeper into the substrate 12 and moves across the etch control dopant gradient, etching process can be reliably terminated to achieve a desirable etch depth, ensuring uniformity amongst the vias from tool to tool or layout to layout. Accordingly, in this way, it is possible to eliminate intrinsic variations in the etch processes, itself, between different tools (e.g., etching chambers) and/or different layouts.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
introducing an etch control dopant into a substrate for a predetermined period of time or concentration in order for the etch control dopant to diffuse to a desired depth within the substrate to form an interface within the substrate between the etch control dopant and material of the substrate;
etching a via within the substrate; and
upon detection of the interface, terminating the etching of the via at the interface such that via etching within the substrate is terminated,
wherein the detecting comprises detecting a rate of change of the etch control dopant as the etching moves across an etch control dopant gradient at the interface between the etch control dopant and material of the substrate, and
wherein the detecting uses an exhaust gas of the etching at an exhaust of an etching chamber.

2. The method of claim 1, wherein the etch control dopant is introduced at a front side of the substrate or a backside of the substrate.

3. The method of claim 1, wherein the etch control dopant is a different species than material of the substrate.

4. The method of claim 1, wherein the etch control dopant is a different concentration than material of the substrate.

5. The method of claim 1, wherein the forming of the interface comprises diffusing the etch control dopant from either a front side or back side of the substrate to a certain depth within the substrate.

6. The method of claim 1, wherein the forming of the interface comprises implanting the etch control dopant from either a front side or back side of the substrate to a certain depth within the substrate.

7. The method of claim 1, wherein the detecting comprises using at least one of a residual gas analyzer (RGA), mass spectrometer, Optical Emission Spectroscopy (OES), laser techniques or an interferometry.

8. The method of claim 1, wherein a concentration of the etch control dopant in the the exhaust will change as the trench etch cuts deeper into the substrate and moves across the etch control dopant gradient.

9. The method of claim 1, wherein the interface is a different dopant or concentration than material of the substrate, and is provided at a predefined depth in the substrate corresponding to a desired depth of the via.

10. The method of claim 9, wherein a known gradient of concentration occurs at other locations in the substrate than the interface.

11. A method comprising:
introducing an etch control dopant into a substrate, the dopant being a different type or concentration than material of the substrate;
etching of one or more trenches into the substrate while monitoring exhaust gas within an at an exhaust of an etching chamber; and
terminating the etching of the one or more trenches when a predetermined rate of change of the etch control dopant concentration is detected as the etching moves across an etch control dopant gradient at an interface between the etch control dopant and material of the substrate.

12. The method of claim 11, wherein the predetermined rate of change of the etch control dopant concentration is an end-point indicator of a via depth.

13. The method of claim 11, wherein the etch control dopant is introduced at a front side of the substrate or a backside of the substrate.

14. The method of claim 11, wherein the introducing the etch control dopant into the substrate comprises diffusing the etch control dopant from either a front side or back side of the substrate to a certain depth within the substrate.

15. The method of claim 11, wherein the introducing the etch control dopant into the substrate implanting the etch control dopant from either a front side or back side of the substrate to a certain depth within the substrate.

16. The method of claim 11, wherein the terminating the etching when a predetermined rate of change of the etch control dopant concentration is detected comprises detecting a presence, absence or rate of change of the etch control dopant the exhaust gas of the etching chamber to determine an end point of the etch process.

17. The method of claim 16, wherein the detecting comprises using at least one of a residual gas analyzer (RGA), mass spectrometer, Optical Emission Spectroscopy (OES), laser techniques or an interferometry.

18. The method of claim 16, wherein a concentration of the etch control dopant in the etch chamber or exhaust will change as the trench etch cuts deeper into the substrate and moves across the etch control dopant gradient.

19. A method comprising:
introducing an etch control dopant into a substrate which is provided to at an end point etching depth, the etch control dopant being a different type or concentration than material of the substrate;
etching of one or more vias into the substrate;
detecting a rate of change of the etch control dopant which occurs at an interface between the etch control dopant and the substrate in exhaust gas of an etching chamber; and
terminating the etching process of the one or more vias based on the detecting of the rate of change of the etch control dopant in the exhaust gas of the etching chamber.

* * * * *

UNITED STATES PATENT AND TRADEMARK OFFICE
CERTIFICATE OF CORRECTION

PATENT NO. : 10,192,748 B2
APPLICATION NO. : 15/297848
DATED : January 29, 2019
INVENTOR(S) : Timothy C. Krywanczyk et al.

Page 1 of 1

It is certified that error appears in the above-identified patent and that said Letters Patent is hereby corrected as shown below:

In the Claims

In Claim 11, Line 11 at Column 5, delete "within an".

Signed and Sealed this
Sixteenth Day of April, 2019

Andrei Iancu
*Director of the United States Patent and Trademark Office*